(12) United States Patent
Briaire (10) Patent No.: US 7,394,414 B2
(45) Date of Patent: Jul. 1, 2008

(54) ERROR REDUCTION IN A DIGITAL-TO-ANALOG (DAC) CONVERTER

(75) Inventor: Joseph Briaire, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/587,105

(22) PCT Filed: Apr. 11, 2005

(86) PCT No.: PCT/IB2005/051185

§ 371 (c)(1),
(2), (4) Date: Oct. 19, 2006

(87) PCT Pub. No.: WO2005/104376

PCT Pub. Date: Nov. 3, 2005

(65) Prior Publication Data

US 2007/0222653 A1    Sep. 27, 2007

(30) Foreign Application Priority Data

Apr. 20, 2004    (EP)    .................................. 04101625

(51) Int. Cl.
*H03M 1/10* (2006.01)
(52) U.S. Cl. ....................................... 341/118; 341/153
(58) Field of Classification Search ................. 341/118, 341/144, 153

See application file for complete search history.

(56) References Cited

U.S. PATENT DOCUMENTS

| 6,118,398 | A | 9/2000 | Fisher et al. | |
|---|---|---|---|---|
| 7,026,967 | B2 * | 4/2006 | Eloranta | ...................... 341/144 |
| 2001/0026235 | A1 * | 10/2001 | Nuijten | ........................ 341/144 |

FOREIGN PATENT DOCUMENTS

| EP | 0 482 845 | 4/1992 |
|---|---|---|
| WO | WO 03/021790 | 3/2003 |

* cited by examiner

*Primary Examiner*—Howard Williams
(74) *Attorney, Agent, or Firm*—Peter Zawilski (57) ABSTRACT

In a method to improve error reduction in a digital-to-analog converter (DAC), comprising a mapping matrix block and a plurality of selectable source units which supply signals that in combination provide for analog output signals, mapping input signals, obtained from digital input signals to be converted into the analog output signals, are supplied to the mapping matrix block. In the mapping matrix block mapping output signals are generated in response to said mapping input signals and to mapping control signals derived from errors occurring in the plurality of selectable source units. At least one of the mapping input signals is applied for the substantially simultaneous generation of the mapping output signals for a number of source units.

19 Claims, 5 Drawing Sheets

ERROR REDUCTION IN A DIGITAL-TO-ANALOG (DAC) CONVERTER

The invention relates to a method to improve error reduction in a digital-to-analog converter (DAC), comprising a mapping matrix block and a plurality of selectable source units which supply signals that in combination provide for analog output signals wherein mapping input signals, obtained from digital input signals to be converted into the analog output signals, are supplied to the mapping matrix block and mapping output signals are generated in response to said mapping input signals and to mapping control signals derived from errors occurring in the plurality of selectable source units.

Digital-to-analog converters in which this method is applied are known, for instance from the International Patent Application, WO 03/021790 or from U.S. Pat. No. 6,118,398, and are constructed with a set of source units supplying signals that in combination provide for an analog output signal. Usually current source units are applied. Nevertheless it is possible to use other types of source units, for example a resistance circuit in which more or less resistances are applied in a serial configuration or a capacitor circuit in which more or less capacitors are applied in a parallel configuration. Further the amount and the type of the source units can be chosen. However, it is common practice to use 1-bit source units, which means that the output of each source unit can only have two possible states and that the state in which a source unit is depends on the digital code that drives said source unit. Also the analog output level of each source unit can be chosen. For instance, a full-binary segmentation can be chosen, which means that the analog output level of each next source unit is twice as high as the level of the previous source unit. In this case only m source units for an m-bit DAC are required. Another extreme would be to have all source units equal to each other, which is called a fall-thermometer segmentation. Now, for an m-bit DAC, $2^m-1$ source units are required.

In practice an intermediate solution will be chosen: the source units that generate the smallest analog output levels follow the binary approach, while the larger analog output levels are constructed with equal source units. For an m-bit DAC this means that the n most significant bits follow thermometer segmentation, while the (m−n) least significant bits follow a binary construction. Hence, this would require $(2^n-1)+(m-n)$ source units. This situation will be called an "n/(m−n) segmentation".

As a consequence of errors or mismatch in the output signal of a source unit compared with other sources a full-binary solution is rarely used. When, for example, current source units are used, the easiest way to design a source unit with twice the current of a reference source unit would be to take two reference source units in parallel and treat them as one new source unit. However, due to several physical factors there will be mismatch between the reference source units, an important part thereof being random. The statistical consequence of random mismatch is that a current source unit constructed with k reference source units will have a mismatch that is square root (sqrt) k times larger than the mismatch of one reference current source unit.

For an m-bit full-binary solution this would mean that the statistical mismatch of the largest current source unit ("half scale") would be sqrt($2^{m-1}$) times larger than the mismatch of the least significant bit (1sb), while the mismatch of all other current source units combined would be sqrt($2^{m-1}-1$) times larger. This means that, on average, the error due to "a one lsb change" from "half scale" minus 1 lsb to "half scale" would be sqrt($2^{m-1}-1+2^{m-1}$), i.e. about $2^{1/2m}$ times larger than the next step: "half scale" to "half scale" plus 1 lsb. For instance, when m=12, this factor will be about 26. To avoid these errors preferably a partial thermometer code should be introduced. For instance, in a 5/7 segmentation (m=12 and n=5) the worst-case lsb-step leads, on average, to an error: sqrt($2^7-1+2^7$), i.e. about 24, which is a four times reduction in statistical peak error for incremental lsb-increases. This is achieved because only one thermometer unit and the reduced number of binary units will change.

The increase in thermometer segmentation, as described above, only influences the error due to incremental increase: if a smaller portion of the total set of source units has to change to arrive at the desired code, a smaller error in the change in output can be expected. This type of error is referred to as the differential non-linearity (DNL).

The absolute value of the mismatch at a certain code remains the same: the "half scale" code for instance requires half of the total set of sources and therefore, for an m-bit DAC the average absolute mismatch remains $2^{1/2m}$ times larger than the error of one lsb. This type of error is referred to as the integral non-linearity (INL).

Besides mismatch that leads to static random errors, mismatch that leads to dynamic errors occur. For an individual source unit this means that the effective switching delay and duty cycle of this source unit differs from another source unit. Also in this case some kind of dynamic DNL that can be reduced via increased thermometer coding could be defined and a dynamic INL that remains unaffected.

Errors that are not random in origin but systematic, can add up differently. Suppose for instance that the source units are physically placed in a square matrix and that because of a fabrication error the exact analog output signal depends on the place the source unit has in the matrix, then there is a spatial dependency between errors and therefore also in the DNL. Such an error, for instance, may lead to a decreasing output signal from the one side of the matrix going to the opposite side. For the INL, this error will increase proportionally to the number of sources that participates, if the source units that are selected happen to increasingly show this systematic error. If this is the case, this type of errors could easily dominate the INL error because of their linear increase compared to the square root increase due to random errors. Effective solutions to this type of systematic errors exist. Essentially, it is assumed that a linear gradient error with an unknown direction exists. Now the summed influence of this error on the INL may be cancelled by placing incremental source units at such positions in the matrix that the error of each next source unit cancels out the error of the previous source unit. For instance, a simple solution to cancel a linear error would be to use a "double spiral" placement: the thermometer sources of all odd data codes are placed in a spiral shape, while the sources of all even codes are placed in a similar spiral that is rotated by 180°. This way the incremental source units are always placed at almost the opposite side of the matrix.

A solution for the problem to minimize random mismatch errors that leads to both static and dynamic errors in the INL and which solution also minimizes the systematic spatial errors, is known from the International Patent Application WO 03/021790, mentioned before. This patent application relates to a method for error reduction in a digital-to-analog converter (DAC) as described in the opening paragraph. In the converter system described in this patent application the errors in the individual source units are measured, where after by means of an algorithm in the processing unit the individual errors are processed to obtain a sequence of current source units switched on in such a way that the INL error of the DAC is minimized, or, in other words, in the processing unit mapping control signals for the mapping matrix block are generated in such a way that with each digital input value a specifically determined sequence and combination of current source units switched on is corresponding. Also in U.S. Pat. No. 6,118,398 mapping control signals are derived with the purpose to minimize the INL error.

The disadvantage of the known method and systems is that only the INL error is minimized; the DNL errors are unaffected, which again results in a seriously restricted improvement of the INL of the DAC.

The purpose of the present invention is to minimize DNL errors and to obtain a very accurate digital-to-analog converter in which also the INL is strongly improved with regard to the state-of-the-art DAC.

According to the invention the method as described in the opening paragraph is characterized in that at least one of the mapping input signals is applied for the substantially simultaneous generation of the mapping output signals for a number of source units.

This means that a number of source units together can be considered as forming a "new" source unit, or, in other words and in terms of the further specification, "a set of original source units". Each of the original source units is controlled by a mapping output signal, while each mapping input signal can be applied for the generation of the mapping output signals for the source units within a specific set of source units. The membership of a source unit to a specific set of source units is determined by the mapping control signals.

It is emphasized that the term source unit not only relates to a strict source, such as a current source, but also to all further components which may influence and are used to obtain the analog output signals, such as latches, buffers, switches, etc. All these components may introduce errors that must be minimized.

Because the specific sets of source units, the "new" source units, are formed in such a way that the resulting value of the error signals in each set is minimized, the DNL is substantially minimized, thus reducing also the INL. By combination with the known processing to minimize the INL, realized when for increasing digital input signals the set error signals are successively selected in such a way that the accumulating error value is substantially minimized, a particularly accurate DAC is obtained.

It is possible to sort the unit sources in different ways. So, when for instance the plurality of source units comprises $3*(2^n-1)$ source units, where n is the number of bits of the digital input signal to be converted, sets of 3 source units may be formed by such a selection of the source units that the resulting error signal of each set is improved. Further it is not necessary that all source units are equal to each other. However, in a more favorable method at least part of the error signals is arranged in at least sets of $1, 2, 4, \ldots, 2^{k-1}$ error signals, with $k \leq n$, each set corresponding with a set of equal source units operable at the same time. Preferably, when k<n, the further error signals may be arranged in further sets of $2^k$ error signals, each set corresponding with a set of equal source units operable at the same time.

In the case that k<n, sets of source units can be considered as "new" source units, which can be combined again. When only sets of two source units are formed, the sets of error signals corresponding with the sets of two source units must, to obtain the relevant analog output signal, be combined with an error signal, preferably the smallest error signal, excluded from the formation of sets of two error signals and corresponding with the most accurate source unit. The new sources can again be combined to further sets of source units, however, under the condition that not only the original source unit corresponding with the error signal excluded from the formation of sets of error signals is required, but also, for each combination of source units of lower order, a combination of such a lower order, remaining after further combination of the source units. Are, for instance, new source units formed by combination of two original source units, only the original source unit with preferably the minimum error signal is further required. When these new source units again are combined to source units of four original source units, then also one new source unit of two original source units is required, preferably the new source unit of two source units with the minimum resulting error value.

Although it is possible that, based on measured errors in the source units the mapping control signals are once determined, for instance by the manufacturer, a more favorable method is obtained when in the digital-to-analog converter programmatically is determined which mapping input signal is supplied to which source unit or source units. In that case the advantage is obtained that, when errors in the source units change in time, with a certain regularity error measurements may be performed and new sets of mapping control signals may be determined.

The invention further relates to a digital-to-analog converter (DAC), for the conversion of n-bit digital signals into analog output signals, comprising a mapping matrix block and a plurality of selectable source units, which supply signals that in combination provide for analog output signals, wherein mapping input signals, obtained from the digital input signals are supplied to the mapping matrix block and in the mapping matrix block mapping output signals are generated in response to said mapping input signals and to mapping control signals derived from errors occurring in the plurality of selectable source units. The digital-to-analog converter is characterized in that the mapping matrix block is constructed in such a way that under the control of mapping control signals, the number of which corresponding with the number of source units, the source units are operated by mapping input signals, the number of which being smaller than the number of source units. Although the mapping control signals can be adjusted by the manufacturer, it is of advantage when the digital-to-analog converter (DAC) comprises a processing unit to generate mapping control signals at any desired moment in response to errors signals derived from errors occurring in the source units.

In a particular embodiment the processing unit comprises memory means for said error signals and sorting means to arrange at least part of the error signals in at least sets of $1, 2, 4, \ldots, 2^{k-1}$ error signals, with $k \leq n$, each set corresponding with a set of substantially equal source units operable at the same time. Preferably, when k<n, the sorting means are capable to arrange further error signals in further sets of $2^k$ error signals, each set corresponding with a set of source units operable at the same time.

The above and other objects and features of the present invention will become more apparent from the following detailed description considered in connection with the accompanying drawings, in which.

Figure 1:
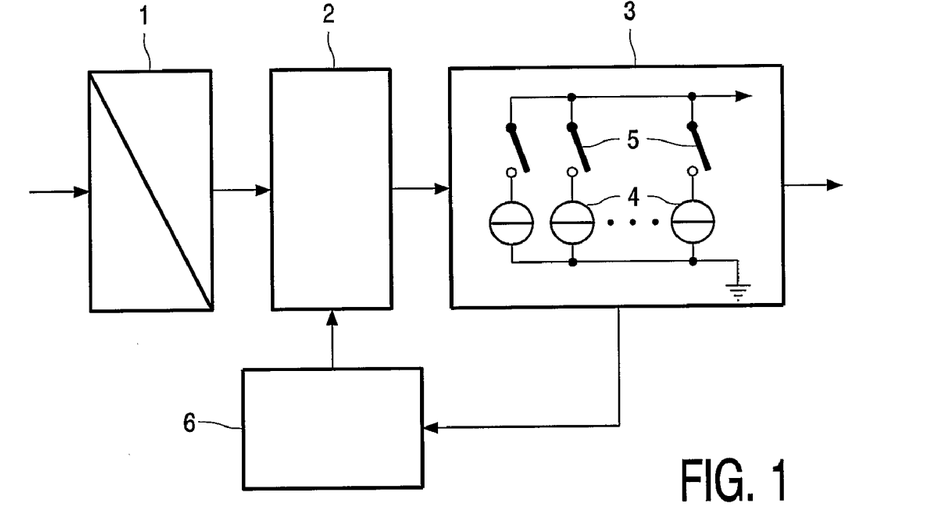
FIG. 1 shows an embodiment of a digital-to-analog converter according to the state of the art.

The known embodiment of FIG. 1 comprises a decoder 1, a mapping matrix block 2, and a plurality of selectable source units 3 with a number of current source units 4 and switches 5, and a processing unit 6. To the decoder n-bit digital input signals are applied and decoded into thermometer-coded signals with $2^n-1$ signal levels, the level zero excluded. The plurality of source units comprises $2^n-1$ substantially equal current source units 4 with additional switches 5. When the current source units are ideal and each of which provides for a current $I_o$ an increasing sequence of thermometer-coded signals can easily be transformed into a series of output currents by successively closing the switches. Than, the source unit gives a sequence of output currents $I_o$, $2I_o$, $3I_o$, etc.

Figure 2:
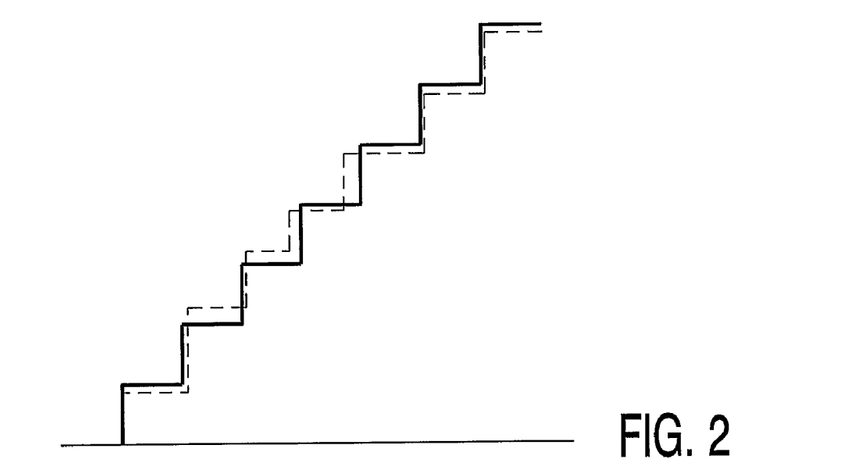
FIG. 2 shows a thermometer-coded signal with several types of errors.
Figure 3:
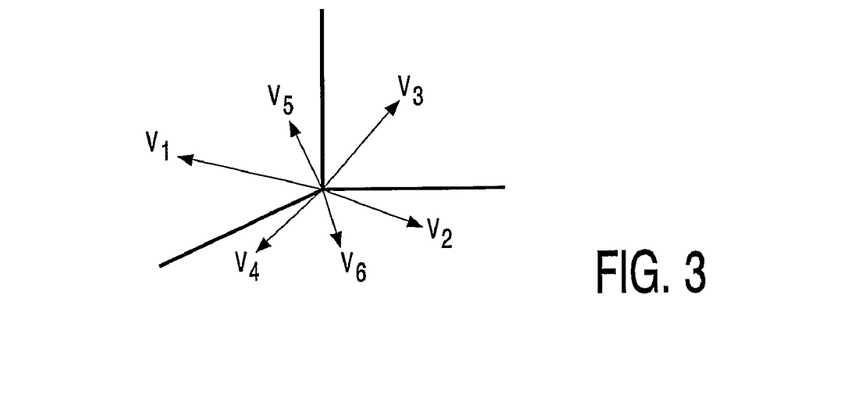
FIG. 3 shows a diagram in which some of these errors are indicated.

However, in practice the currents from the several current source units are not equal. This is illustrated in FIG. 2 in which with an uninterrupted line the ideal sequence of output currents is indicated, while a practical sequence including several types of errors is indicated by the interrupted line. The errors may be in the form of dc mismatch and timing mismatch, particularly by switching delay or switching skew. These errors are measured by measuring means being part of the plurality of source units 3; it will be evident that they can also form part of the processing unit 6. In the case of three types of errors, for example, as mentioned above, FIG. 3 shows the resulting errors in the form of vectors. By processing the error vectors the accuracy of the converter can be improved, particularly by changing the sequence in which the source units 4 are operated. This change of sequence is based on the selection of pairs of error vectors that are more or less opposite to each other and do not differ too much in length. For example, to obtain an increased sequence of thermometer-coded signals as shown in FIG. 2, first the current sources with error vectors V1 and V2 are successively switched on, then the current sources with error vectors V3 and V4, next the current sources with error vectors V5 and V6, etc. The result is that after a source unit with some error is operated on, the next source unit operated will be a source unit with a similar error but opposite in sign so that, when the respective source units are operated one after another, the two errors almost cancel each other, with the effect that the INL will be improved. However, the DNL remains, thus restricting the INL improvement. In the case of only dc mismatch this will be further explained with reference to FIGS. 4-7.

Figure 4:
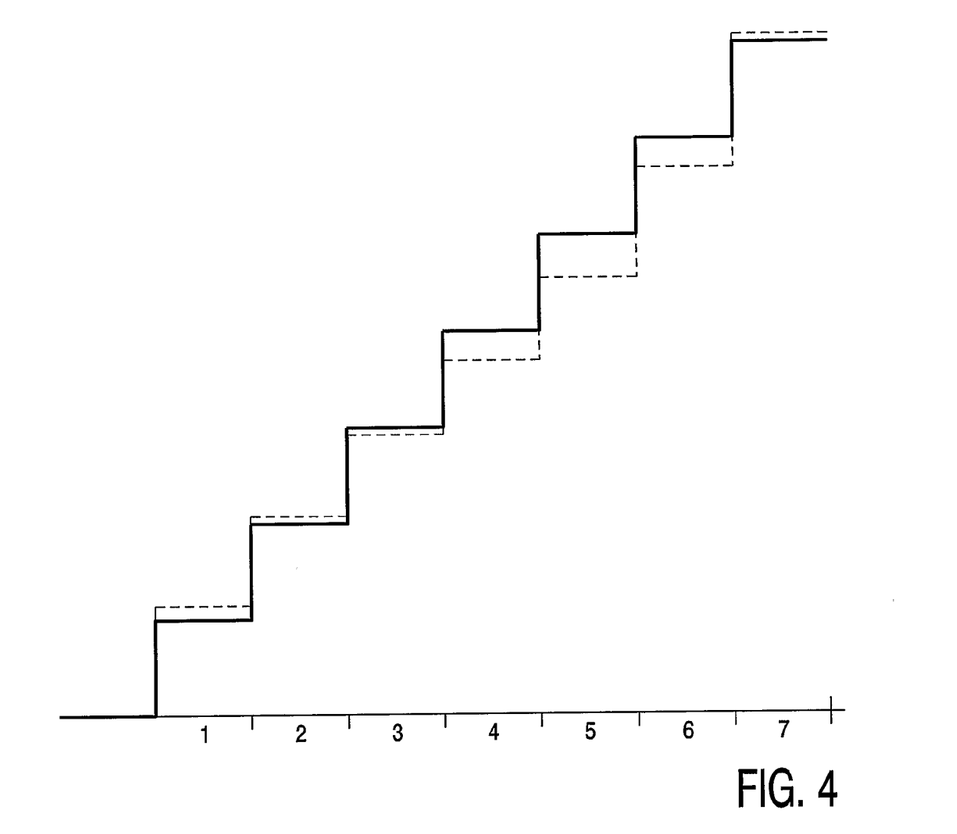
FIG. 4 shows a thermometer-coded signal with only dc mismatch errors.
Figure 5:
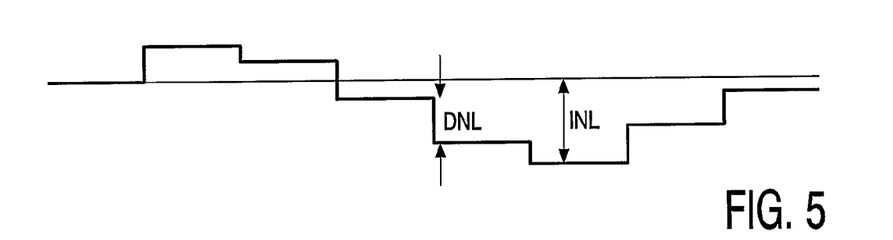
FIG. 5 shows the DNL/INL of the thermometer-coded signal of FIG. 4.
Figure 6:
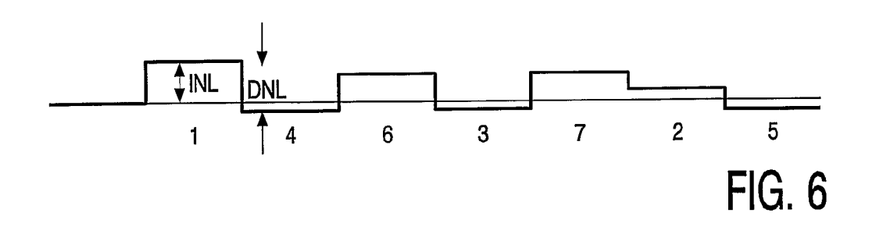
FIG. 6 shows the DNL/INL of the thermometer-coded signal of FIG. 4 after application of the measurements according to the state of the art document.

FIG. 4 shows an increased sequence of thermometer-coded signals with 7 signal levels, the level zero excluded, whereby the source units 1, 2, . . . 7 are successively operated. On the same way as in FIG. 2 the uninterrupted line represents the ideal sequence of output currents, while in a practical sequence the interrupted line indicates dc mismatch errors. In a fictive example it will be supposed that the measured errors in the successive source units 1, 2, . . . , 7 can be represented by values 4, −2, −4, −5, −2, 4 and 4. The cumulated dc mismatch errors are shown in FIG. 5 (for clarity sake the errors in FIGS. 5 and 6 are drawn twice as large as in FIGS. 4 and 7). The cumulated values in this example can be represented by the values 4, 2, −2, −7, −9, −5 and −1. The maximum INL value is 9, while the maximum DNL value is 5.

When the source unit with the largest current, source unit 1, is followed in sequence to be operated by the source unit with an error similar to the former source unit but with opposite sign, source unit 4, and next the source unit with the then largest current, source unit 6, followed by the source unit with an error similar to the then former source unit but with opposite sign, source unit 3, etc., the source units will be operated in the sequence 1, 4, 6, 3, 7, 2 and 5 as shown in FIG. 6, with the result an improved INL. Then, the errors in the successive source units can be represented by the values 4, −5, 4, −4, 4, −2 and −2, and the cumulated values by 4, −1, 3, −1, 3, 1 and −1. The maximum INL value is 4; the maximum DNL has still the value 5.

Figure 7:
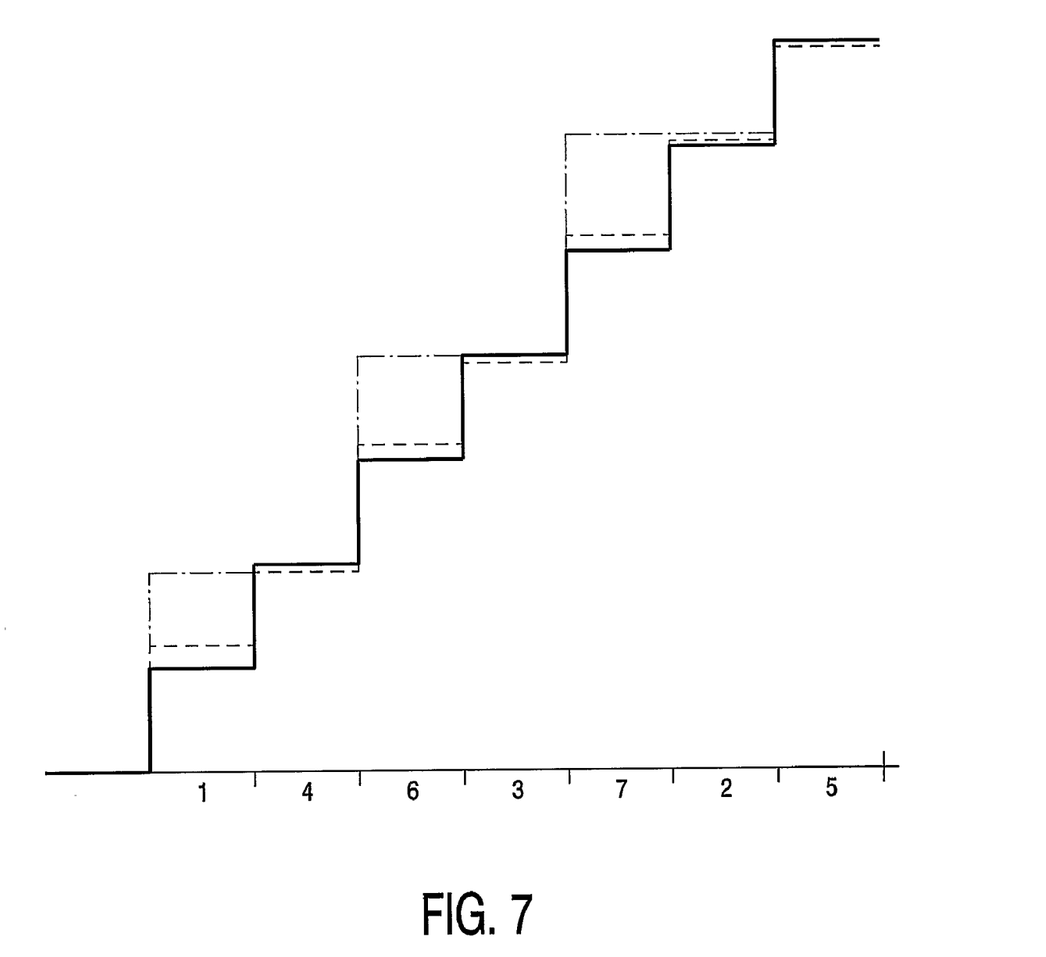
FIG. 7 shows a thermometer-coded signal by applying the invention.

To improve the DNL a further processing will be necessary. By combining each time two source units operated in sequence new current source units are formed. In the above example this means that the source units 1 and 4 are always operated together and form a new current source unit 1'. The source units 6 and 3 are always operated together and form a new current source unit 2' and the source units 7 and 2 are always operated on together and form a new current source unit 3'. The remaining, most accurate, source unit 5 will be maintained. This situation is shown in FIG. 7. Now by switching on only source unit 5 the first thermometer level will be obtained. By switching on source unit 1' and switching off source unit 5 thermometer level 2 will be obtained. Thermometer level 3 will be obtained by switching on source units 5 and maintaining source unit 1'; thermometer level 4 by switching on source unit 2', switching off source unit 5 and maintaining source unit 1'; thermometer level 5 by switching on source unit 5 and maintaining source units 1' and 2'; thermometer level 6 by switching on source units 3', switching off source unit 5 and maintaining source units 1' and 2', while thermometer level 7 will be obtained by switching on source unit 5 and maintaining source units 1', 2' and 3'. So, source unit 5 will be alternatively switched on and off. The new current source units 1', 2' and 3' have an error with a value corresponding with the mean value of the errors in the individual current source units that form the new current source units. In the present example the errors in the successive source units 5, 1', 2' and 3' can be represented by the values −2, −1, 0 and 2. The errors in the successive output currents can now be represented by the values −2, −3, −2, 0, −2, 2 and −2. The maximum INL and the maximum DNL both are 3.

This process can be repeated. Based on a new measurement of errors in the source units 1', 2' and 3', these new source units can be rearranged and again new current source units, now consisting of four of the original source units can be formed by switching on two selected current source units each of which being a combination of two original current source units together. In the present example the source units 1' and 3' can be used to form a new current source unit 1". Besides the source unit 5, again the remaining, most accurate combined current source unit 2' will be maintained. Now, by switching on source unit 5 the first thermometer level will be obtained. The second thermometer level will be obtained by switching off source unit 5 and switching on source unit 2'; thermometer level 3 by switching on source unit 5 and maintaining source unit 2'; thermometer level 4 by switching off source units 5 and 2' and switching on source unit 1"; thermometer level 5 by switching on source unit 5 and maintaining source unit 1"; thermometer level 6 by switching off source unit 5, switching on source unit 6 and maintaining source unit 1"; thermometer level 7 by switching on source unit 2' and maintaining source units 5 and 1". In the present example the errors in the successive current source units 5, 2' and 1" can be represented by the values −2, 0 and 1. The errors in the successive output currents can now be represented by the values −2, 0, −2, 1, −1, 1 and −1. The maximum INL and the maximum DNL both are 2.

In this process two times error measurement has taken place; also the current source units 1', 2' and 3' are rearranged before a combination of four original current source units is performed. However, it is also possible to select directly, based on the first error measurement, combinations of four current source units.

When again it will be supposed that the measured errors in the successive current source units 1, 2, . . . , 7 can be represented by values 4, −2, −4, −5, −2, 4 and 4, current source units 1, 4, 6 and 3 together can directly form a new current source unit 1", the source units 7 and 2 can form a current source unit 1' and source unit 5 will be maintained as the most accurate source unit. Now the errors in the successive current source units 5, 1' and 1" can be represented by the values −2, 2 and −1, and the errors in the successive output currents by the values −2, 2, −2, −1, −3, 1 and −1. The maximum INL is 3 and the maximum DNL is 2. So, it is dependent on the algorithm used in the processing unit 6, which result will be obtained. In the present example it seems to be of advantage to apply a repeated process of error measurement, rearranging and combining (sorting). With a larger number of thermometer levels this result may be more pregnant.

In general the process in the most favorable form is as follows. For n-bits digital input signals and $2^n$ thermometer levels, level 0 is excluded while for the other $2^n-1$ levels, with a starting value of the mapping control signals supplied by the processing unit 6 to the mapping matrix block, the errors in the $2^n-1$ current source units are measured. Based on the measuring results the sequence of current source units operated with increasing thermometer-coded signals is rearranged in such a way that the INL is improved optimally. There after the most accurate current source unit will be taken apart, while the other $2^n-2$ current source units are combined to $2^{n-1}-1$ new current source units. The successive output currents corresponding with the increasing thermometer-coded signals is obtained by switching on the most accurate source unit, and further, alternately with each step in the increasing thermometer-coded signal, switching off and on said most accurate current source unit, and switching on with each even step in the increasing thermometer-coded signal an additional new current source unit.

When this process is performed directly or after new error measurement and rearranging combined pairs of current source units, the most accurate source unit and the most accurate pair of source units must be maintained, while the other are combined to $2^{n-2}-1$ sets of four source units. In practice n will be sufficiently high so that sets of 8 or 16 source units, or in general $2^k$, can be formed. In the latter general case the number of sets will be $2^{n-k}-1$, while further most accurate sets of 1, 2, 4, . . . and $2^{k-1}$ source units must be available.

In this general case, when k<n, $2^{n-k}-1$ sets of each $2^k$ error signals are applied in combination with most accurate sets of 1, 2, 4, . . . and $2^{k-1}$ error signals to obtain $(2^{n-k}-1)*2^k+(1+2+4+ \ldots +2^{k-1})=2^n-1$ mapping control signals for the $2^n-1$ source units.

When k=n, it is sufficient to use sets of 1, 2, 4, . . . , $2^{n-1}$ error signals to obtain $(1+2+4+ \ldots +2^{n-1})$, i.e. $2^n-1$ mapping control signals for the $2^n-1$ source units. In this particular situation a thermometer coding is not necessary at all.

Figure 8:
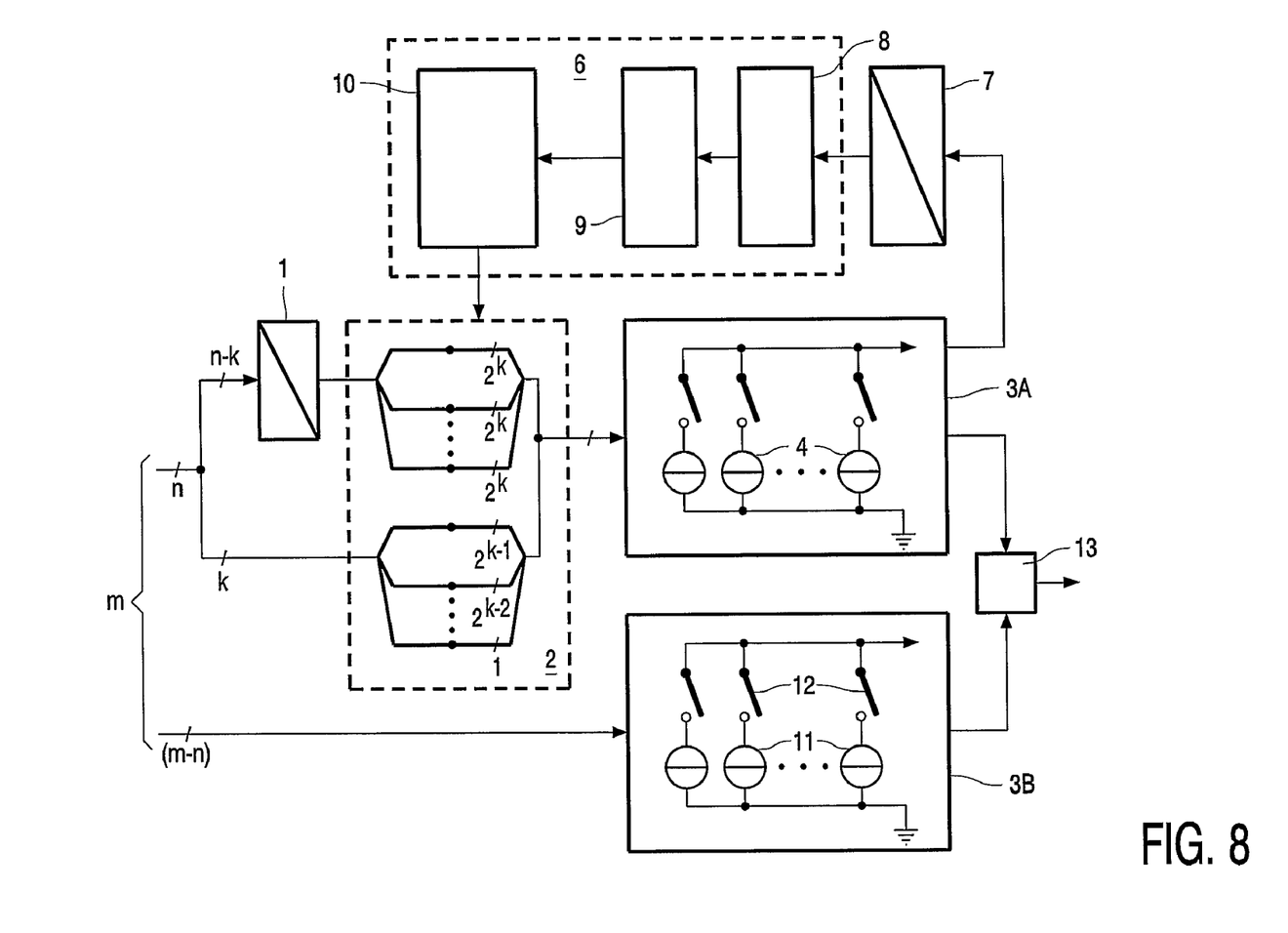
FIG. 8 shows a preferred embodiment of a DAC according to the invention with k<n.
Figure 9:
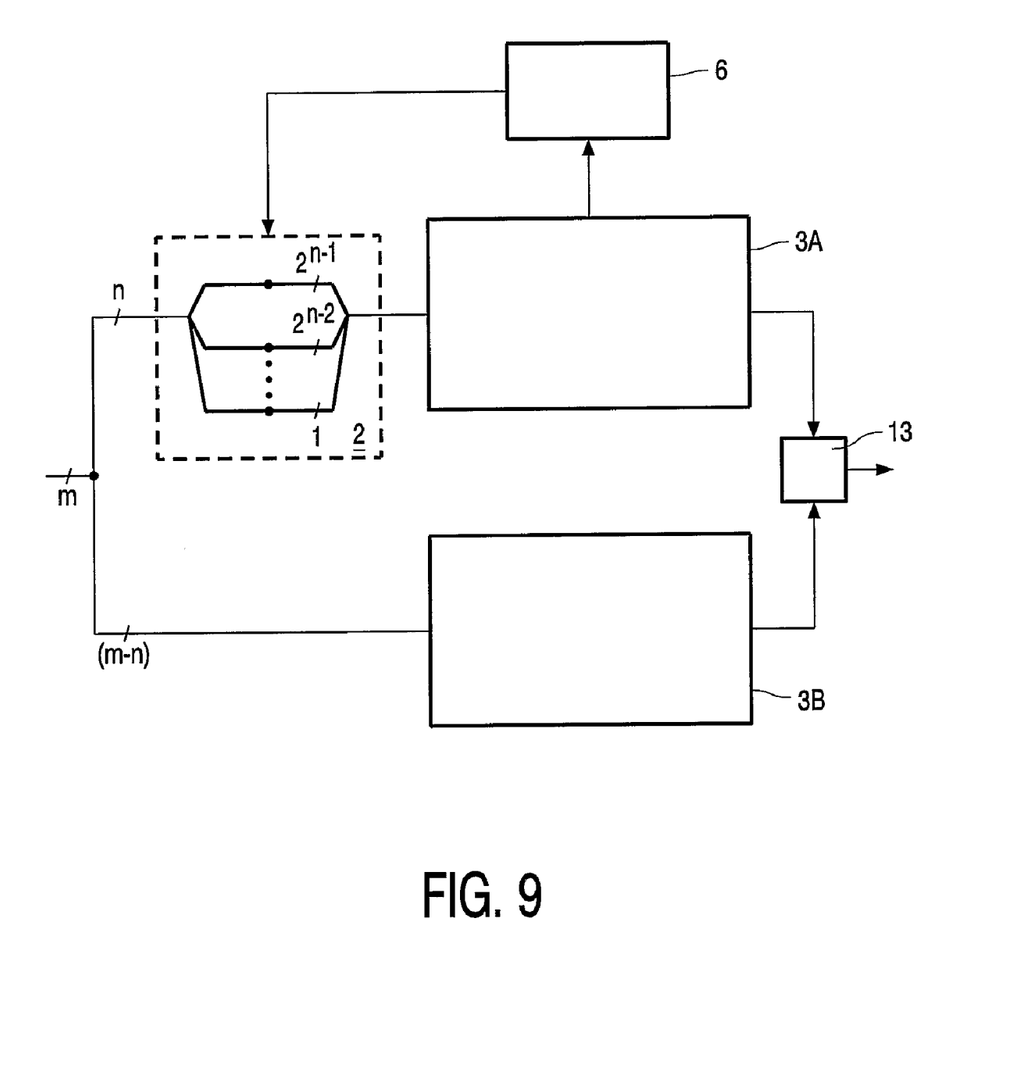
FIG. 9 shows a particular embodiment of a DAC according to the invention with k=n.

Both cases will be further clarified with reference to FIGS. 8 and 9 respectively. In both figures the dots in the mapping matrix block 2 indicate that a single mapping input signal line can be connected to a number of mapping output signal lines, where by means of the mapping control signals is determined which mapping input signal line is connected with which mapping output signal line or lines.

In a preferred embodiment of a digital-to-analog converter to convert m-bits digital input signals into analog output signals the n most significant bits are processed to obtain mapping output signals for sets of source units as described above, while the (m−n) least significant bits directly control source units in a binary segmentation. An example thereof will be given for m>n>k and is illustrated in FIG. 8.

From the n most significant bits the most significant (n−k) bits are supplied to a decoder 1 and converted into a thermometer coded signal. The thermometer coded signal and the k least significant of the n bits form the mapping input signals for the mapping matrix block 2. In this embodiment the decoder 1, the mapping matrix block 2 and the plurality of source units 3a are equal to the corresponding parts in FIG. 1. The plurality of source units 3a comprises $2^n-1$ current source units 4 and error measuring means to derive error signals corresponding with errors occurring in separate source units in the plurality of source units 3a. These error signals are supplied to an analog-to-digital converter 7, to convert the measured error signals in digital signals. The analog-to-digital converter 7 can, for example, be of the type of a $\Sigma\Delta$ converter; it is not important that the conversion process is performed with a high processing rate, more important is that the errors are accurately measured. The error signals together with addresses indicating the specific source units from which the error signals are derived are registered in memory means 8, being part of the processing unit 6. The processing unit 6 further comprises sorting means 9 and control means 10. In the sorting means the error signals are rearranged in such a way that the integral non-linearity of the converter is optimized. This means that with an increasing digital value of the n-bit digital signal a specific sequence of source units is operated. There after the error signals are arranged in sets of error signals, except the smallest error signal, which sets are selected in such a way that the resulting value of the error signals in each set is substantially minimized, each set corresponding with a combination of two source units operable at the same time. In the control means 10 the mapping control signals are generated, whereby, with an increasing digital value of the n-bit digital input signal, sets of two source units are successively switched on, alternated with a switching on and off of the most accurate source unit. For sake of simplicity it is supposed that based on the error measurement performed before the formation of sets of two source units all further sets of error signals of higher order corresponding with sets of current sources, consisting of 4, 8, . . . original current sources are formed. By the $2^{n-k}-1$ possible output signals of the decoder 1, $2^{n-k}-1$ new sources of each $2^k$ original source units can be controlled. By the remaining k least significant of the n bits digital input signal, source units consisting of 1, 2, . . . , $2^{k-1}$ original source units can be controlled. Totally by the n bits digital signal $(2^{n-k}-1)*2^k+(1+2+4+ \ldots +2^{k-1})=2^n-1$ original source units are controlled. However, by the rearranging in sets of errors, this control requires only $(2^{n-k}-1)+k$ different mapping input signals. In this embodiment it is supposed that the most accurate source unit is controlled by the least significant of the k bits supplied to the mapping matrix block, that the most accurate source unit of two original source units is controlled by the penultimate least significant of the k bits supplied to the mapping matrix block, etc.

The (m−n) least significant bits are used in combination with a binary segmentation of the plurality of source units 3b. This means that the analog level of each next current source unit is twice as high as the level of the previous source unit. The largest of these output signals has substantially half the output value of any of the source units in the plurality of source units 3a. When, for instance, (m−n)=3, the plurality of source units 3b comprise three current source units 11 and switches 12 to switch on currents $I_{lsb}$, $2I_{lsb}$ and $4I_{lsb}$, with $I_{lsb}=\frac{1}{8}*I_o$ in such a way that all the fine current levels between two levels, determined by the n most significant bits are covered. In the combination circuit 13 the analog output signals of the plurality of sources units 3a and 3b are combined to provide for the analog signals corresponding with the m-bit digital signals to be converted.

FIG. 9 shows a particular embodiment in which n=k. This embodiment can easily be derived from the embodiment of FIG. 8 by deleting the decoder 1 and simplification of the mapping matrix block 2. This means that a full binary segmentation is applied, which up to now in practice is rarely done. The processing of the errors in the plurality of source units 3a and the processing of the (m−n) bits in the plurality of source units 3b are the same as in the embodiment of FIG. 8. Based on error measurement and error processing mapping control signals are derived by the formation of sets of error signals, consisting of $1, 2, \ldots, 2^{n-2}, 2^{n-1}$ error signals. Now, the $2^n-1$ current source units, rearranged to sets of $1, 2, \ldots, 2^{n-2}, 2^{n-1}$ current source units, are controlled by n different mapping input signals.

In the embodiment of FIG. 8, for n=4 and k=2, five different mapping input signals are necessary to control sets of 1, 2 and 3×4 source units; in the embodiment of FIG. 9, with n=k=4, four different mapping input signals are necessary to control sets of 1, 2, 4 and 8 source units.

The examples described herein are intended to be taken in an illustrative and not limiting sense. Various modifications may be made to the method and the embodiment described by persons skilled in the art without departing from the scope of the present invention as defined in the appended claims. Particularly the processing unit can be programmatically realized in a very sophisticated manner with respect to analyzing the measured error signals and the forming of sets of error signals, but also rather simple and partly realized in hardware; hence, many algorithms are possible. New mapping control signals can be generated for example each time the DAC is switched on, or periodically, after performing a new error measuring. Further it can be noted that there is no specific sequence in optimizing the DNL and the INL. The algorithm can be such that the optimizing procedure for both the DNL and the INL are integrated and performed during rearranging and combining error signals. Also the number of sources units present in the plurality of source units can be larger than the required number of source units. This provides for the possibility of not making use of the source units with the largest errors and to eliminate them for instance in a pre-selection stage. Although in the figures single ended current sources are indicated, by means of which a switching between 0 and 1 can be realized, differential structures, often used in practice and by means of which a switching for example between 1 and −1, are possible.

The invention claimed is:

1. A method of error reduction in a digital-to-analog converter (DAC), the DAC having a mapping matrix block and a plurality of selectable source units which supply signals that in combination provide for analog output signals wherein mapping input signals, obtained from digital input signals to be converted into the analog output signals, are supplied to the mapping matrix block and mapping output signals are generated in response to said mapping input signals and to mapping control signals derived from errors occurring in the plurality of selectable source units, the method comprising:
grouping sets of selectable source units from the plurality of selectable source units based upon the errors occurring in the plurality of selectable source units, wherein the sets of selectable source units include a first set of one selectable source unit and a plurality of sets, each set having two or more selectable source units;
generating the mapping control signals from the mapping input signals, the mapping control signals selecting one or more set of the sets of selectable source units, wherein, for an incremental increase in a digital value of the digital input signals, sets of the plurality of sets of two or more selectable source units are successively switched on while alternating with switching on and off the first set of one selectable source unit;
wherein, at least one of the mapping input signals is applied for the substantially simultaneous generation of the mapping output signals for a number of source units.

2. Method according to claim 1, characterized in that mapping input signals control at least sets of $1, 2, 4, \ldots, 2^{2-1}$ equal source units operable at the same time respectively.

3. Method according to claim 2, characterized in that mapping input signals control one or more further sets of $2^k$ source units operable at the same time respectively.

4. Method according to claim 1, characterized in that programmatically is determined which mapping input signal controls which source unit or which set of source units.

5. Method according to claim 4, characterized in that programmatically a number of mapping control signals is determined corresponding with the number of source units.

6. Method according to claim 1, for the conversion of n-bit digital input signals into analog output signals, characterized in that error signals are derived from the errors occurring in the source units, and that at least part of the error signals is arranged in at least sets of $1, 2, 4, \ldots, 2^{k-1}$ error signals, with $k \leq n$ each set corresponding with a set of substantially equal source units.

7. Method according to claim 6, characterized in that further error signals are arranged in further sets of 2 k error signals, each set corresponding with a set of substantially equal source units.

8. Method according to claim 6, characterized in that for increasing digital input signals the sets of error signals are selected in such a way that both the resulting value of the error signals in each set and the accumulating error value is substantially minimized.

9. Method according to claim 6, characterized in that at least part of the mapping input signals is obtained by thermometer coding the (n−k) most significant bits of the digital input signal.

10. Method according to claim 6, characterized in that at least $2^{n-k}-1$ sets of $2^k$ source units and at least sets of $1, 2, 4, \ldots$ and $2^{k-1}$ source units are available to generate the analog output signals.

11. Method according to claim 10, characterized in that, after measurement of errors in the $2^n-1$ separate source units, mapping control signals are generated for values of k=1, where after, with increasing steps in k, each time after measurements of errors in the $2^{n-k}-1$ sets of $2^k$ source units mapping control signals are generated for values of k=2, 3, . . . .

12. Digital-to-analog converter (DAC) in which the method according to claim 1 is applied.

13. A method of error reduction in a digital-to-analog converter (DAC), wherein the most significant n bits of m-bit digital input signals are processed by using a mapping matrix block and a plurality of selectable source units which supply signals that in combination provide for analog output signals wherein mapping input signals, obtained from digital input signals to be converted into the analog output signals, are supplied to the mapping matrix block and mapping output signals are generated in response to said mapping input signals and to mapping control signals derived from errors occurring in the plurality of selectable source units, the method comprising:

grouping sets of selectable source units from the plurality of selectable source units based upon the errors occurring in the plurality of selectable source units, wherein the sets of selectable source units include a first set of one selectable source unit and a plurality of sets of two or more selectable source units;

generating the mapping control signals from the mapping input signals, the mapping control signals selecting one or more set of the sets of selectable source units, wherein for an incremental increase in a digital value of the digital input signals sets of the plurality of sets of two or more selectable source units are successively switched on and alternated with switching on and off the first set of one selectable source unit;

wherein, at least one of the mapping input signals is applied for the substantially simultaneous generation of the mapping output signals for a number of source units, and the (m−n) least significant bits are applied as control signals for source units which supply output signals that are all twice as large with respect to each other, the largest of these output signals having substantially half the output value of one of the source units, said output signals providing in combination with each other for an analog output signal.

14. A digital-to-analog converter (DAC), for the conversion of n-bit digital input signals into analog output signals, comprising a mapping matrix block and a plurality of selectable source units, which supply signals that in combination provide for analog output signals, wherein mapping input signals, obtained from the digital input signals are supplied to the mapping matrix block and in the mapping matrix block mapping signals are generated in response to said mapping input signals and to mapping control signals derived from errors occurring in the plurality of selectable source units, wherein the mapping matrix block is constructed in such a way that under the control of mapping control signals, the number of which corresponding with the number of source units, the source units are operated by mapping input signals, the number of which being smaller than the number of source units.

15. Digital-to-analog converter (DAC) according to claim 14, characterized in that a processing unit is provided to generate mapping control signals in response to errors signals derived from errors occurring in the source units.

16. Digital-to-analog converter (DAC) according to claim 15, characterized in that the processing unit comprises memory means for said error signals and sorting means to arrange at least part of the error signals in at least sets of 1, 2, 4, ..., $2^{k-1}$ error signals, with $k \leq n$, each set corresponding with a set of substantially equal source units operable at the same time.

17. Digital-to-analog converter (DAC) according to claim 16, characterized in that the sorting means are capable to arrange further error signals in further sets of 2 k error signals, each set corresponding with a set of substantially equal source units operable at the same time.

18. Digital-to-analog converter (DAC) according to claim 17, characterized in that a decoder is provided to convert the (n−k) most significant bits of the n-bit digital input signals into thermometer coded signals to obtain at least part of the mapping input signals.

19. A digital-to-analog converter (DAC) for converting the n most significant bits of m-bit digital input signals into analog output signals, the DAC comprising a mapping matrix block and a plurality of selectable source units, which supply signals that in combination provide for analog output signals, wherein mapping input signals obtained from the digital input signals are supplied to the mapping matrix block and in the mapping matrix block mapping signals are generated in response to said mapping input signals and to mapping control signals derived from errors occurring in the plurality of selectable source units, wherein the mapping matrix block is constructed in such a way that under the control of mapping control signals, the number of which corresponding with the number of source units, the source units are operated by mapping input signals, the number of which being smaller than the number of source units, wherein a further plurality of selectable source units is provided which, in response to the (m−n) least significant bits, supply signals that are all twice as large with respect to each other, the largest of these output signals having substantially half the output value of one of the source units, said output signals providing in combination for an analog output signal, the digital-to-analog converter further including a combination circuit to combine said analog output signal with the output signal of the digital-to-analog converter.

* * * * *

UNITED STATES PATENT AND TRADEMARK OFFICE
CERTIFICATE OF CORRECTION

PATENT NO. : 7,394,414 B2  
APPLICATION NO. : 11/587105  
DATED : July 1, 2008  
INVENTOR(S) : Joseph Briaire Page 1 of 1

It is certified that error appears in the above-identified patent and that said Letters Patent is hereby corrected as shown below:

In the Claims

In column 2, line 23 (claim 2, line 2), after "1, 2, 4,...," and before "equal source" change "$2^{2-1}$" to "$2^{k-1}$".

In column 2, line 43 (claim 7, line 2), after "sets of" and before "error signals" change "2 k" to "$2^k$".

In column 2, line 17 (claim 17, line 3), after "sets of" and before "error signals" change "2 k" to "$2^k$".

Signed and Sealed this  
Eighth Day of July, 2014

Michelle K. Lee  
*Deputy Director of the United States Patent and Trademark Office*